(12) United States Patent
Mathew et al.

(10) Patent No.: US 7,282,426 B2
(45) Date of Patent: Oct. 16, 2007

(54) METHOD OF FORMING A SEMICONDUCTOR DEVICE HAVING ASYMMETRIC DIELECTRIC REGIONS AND STRUCTURE THEREOF

(75) Inventors: Leo Mathew, Austin, TX (US); Venkat R. Kolagunta, Austin, TX (US); David C. Sing, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 298 days.

(21) Appl. No.: 11/092,289

(22) Filed: Mar. 29, 2005

(65) Prior Publication Data

US 2006/0223335 A1    Oct. 5, 2006

(51) Int. Cl.
*H01L 21/425* (2006.01)
(52) U.S. Cl. ............... 438/525; 438/528; 438/981; 257/E21.625
(58) Field of Classification Search ........... 438/407, 438/525, 528, 981; 257/E21.625
See application file for complete search history.

(56) References Cited

U.S. PATENT DOCUMENTS 6,127,248 A * 10/2000 Kim ................ 438/528
6,352,885 B1 * 3/2002 Wieczorek et al. ....... 438/981
6,713,333 B2 * 3/2004 Mayuzumi ............. 438/981
6,746,924 B1    6/2004 Lee et al.
6,806,584 B2   10/2004 Fung et al.

OTHER PUBLICATIONS

Filed Jun. 30, 2004 as U.S. Appl. No. 10/909,095.

* cited by examiner

*Primary Examiner*—Chandra Chaudhari
(74) *Attorney, Agent, or Firm*—Kim-Marie Vo

(57) ABSTRACT

A method for forming a semiconductor device including forming a semiconductor substrate; forming a gate electrode over the semiconductor substrate having a first side and a second side, and forming a gate dielectric under the gate electrode. The gate dielectric has a first area under the gate electrode and adjacent the first side of the gate electrode, a second area under the gate electrode and adjacent the second side of the gate electrode, and a third area under the gate electrode that is between the first area and the second area, wherein the first area is thinner than the second area, and the third area is thinner than the first area and is thinner than the second area.

18 Claims, 3 Drawing Sheets

METHOD OF FORMING A SEMICONDUCTOR DEVICE HAVING ASYMMETRIC DIELECTRIC REGIONS AND STRUCTURE THEREOF

FIELD OF THE INVENTION

This invention relates generally to semiconductor devices, and more specifically, to semiconductor devices having asymmetric dielectric regions.

BACKGROUND

Semiconductor devices, such as MOSFETs (metal oxide semiconductor field effect transistors), may have asymmetrically doped source and drain regions to increase drive currents and reduce parities. In the prior art, the asymmetrical source and drain doped regions may have different dopants or different numbers of implanted regions. In addition, to form the different dopant regions, spacers on either side of a gate electrode may be different shapes or sizes. While these prior art techniques allow for increased drive current, to form these asymmetrically doped semiconductor devices additional process steps are used that undesirably increase cycle time. Therefore, a need exists for obtaining the advantages of asymmetrically doped source and drain regions without dramatically increasing cycle time.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
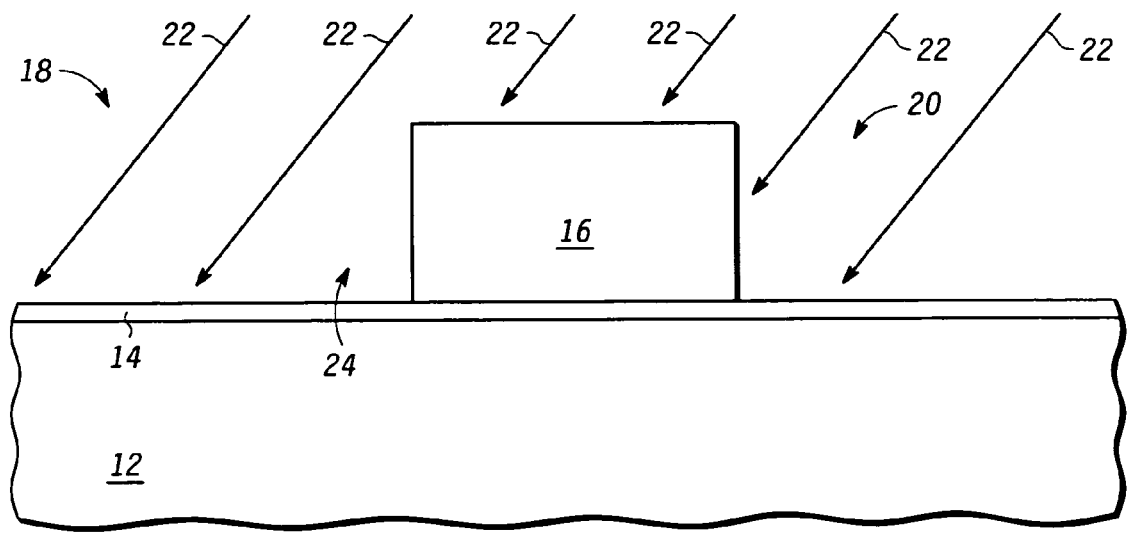
FIGS. 1 illustrates a cross-sectional view of a portion of a workpiece while implanting an oxidation enhancing species in accordance with an embodiment of the present invention.

FIG. 1 illustrates a cross-sectional view of a portion of a workpiece 10 having a semiconductor substrate 12, a first dielectric layer 14, a gate electrode 16, a source region 18, and a drain region 20, while an implantation is being performed. The workpiece 10 is a portion of a semiconductor wafer and will undergo various processing to form a semiconductor device. The semiconductor substrate 12 can be any semiconductor material or combinations of materials, such as gallium arsenide, silicon germanium, silicon-on-insulator (SOI) (e.g., fully depleted SOI (FDSOI)), silicon, monocrystalline silicon, the like, and combinations of the above. The first dielectric layer 14 may be silicon dioxide, a high dielectric constant (hi-k) dielectric (such as hafnium oxide or zirconium oxide), the like, or a combination the above. In one embodiment, the first dielectric layer 14 is hafnium oxide with an underlying layer of silicon dioxide, which may be a native silicon dioxide. Although as shown in FIG. 1 the first dielectric layer 14 is not patterned, it may be patterned. For example, portions of the first dielectric layer 14 that are not under the gate electrode 16 may be removed while patterning a gate electrode layer to form the gate electrode 16. The gate electrode 16 may be any suitable material, such as polysilicon (which subsequently may be doped), a metal gate, the like, or combinations of the above. The first dielectric layer 14 and the gate electrode 16 are formed by any suitable processes such as thermal oxidation, chemical vapor deposition (CVD), physical vapor deposition (PVD), the like, and combinations of the above. A skilled artisan should recognize that the source region 18 and the drain region 20 may be switched so that the source region 18 is to the right of the gate electrode 16 and the drain region 20 is to the left of the gate electrode 16. In one embodiment, at this point in the processing there has been no doping to form source and drain regions in the source region 18 or the drain region 20. In other words, no extensions or halo implants have occurred.

The workpiece 10 in FIG. 1 is being implanted with an oxidation enhancing species 22. As will be better understood after further explanation, the oxidation enhancing species 22 is being implanted into portions of the semiconductor substrate 12 and the gate electrode 16 so that oxidation growth will be increased in these regions. Although not shown, a mask, such as a photoresist, may be formed over the workpiece 10 (and over the semiconductor substrate 12) and be patterned to expose the areas where the oxidation enhancing species 22 are to be located within the workpiece 10. If a mask is used, the implantation may occur perpendicular to the workpiece 10 or at a tilt so that the angle between the semiconductor substrate 12 and the implantation is less than ninety degrees. If a mask is not used or if the mask is patterned to expose both the source region 18 and the drain region 20, a tilt is preferred so that a shadow region 24 can be formed in one of the regions, which in a preferred embodiment is the source region 18. The shadow region 24 is a region where none of the oxidation enhancing species 22 will travel so that areas around the shadow region 24 will not be implanted with the oxidation enhancing species 22. In the embodiment illustrated in FIG. 1, the shadow region 24 prevents oxidation enhancing species 22 from being implanted into portions of the first dielectric layer 14, the gate electrode 16, and the semiconductor substrate 12, as will be better understood after discussing FIG. 2. In one embodiment, the tilt is approximately 5 to 30 degrees. However, the most desirable tilt will depend on the height and density of the gate electrode 16. The taller and more dense the gate electrode 16, it is desirable to use a lower tilt angle.

The oxidation enhancing species 22 may be oxygen, germanium, fluorine, chlorine, the like or combinations of the above. The energy used is desirably low enough so that the oxidation enhancing species 22 reaches the desired depth in the semiconductor substrate 12 and the gate electrode 16. In one embodiment, the desired depth is approximately 5 to 10 nm. In one embodiment, the energy is between approximately 2 and 8 keV. The actual energy chosen depends on the desired depth, which can vary based on the dimensions of the features, other processing that may occur, and the species used. Furthermore, any dose can be used. In one embodiment, a dose of 1E15/cm$^2$ is used. In a preferred embodiment, germanium is used as the oxidation enhancing species 22 at a 5 keV and a dosage of 1E15/cm$^2$. In one embodiment, it is desirable to use fluorine for an N-type semiconductor device and germanium for a P-type semiconductor device.

Figure 2:
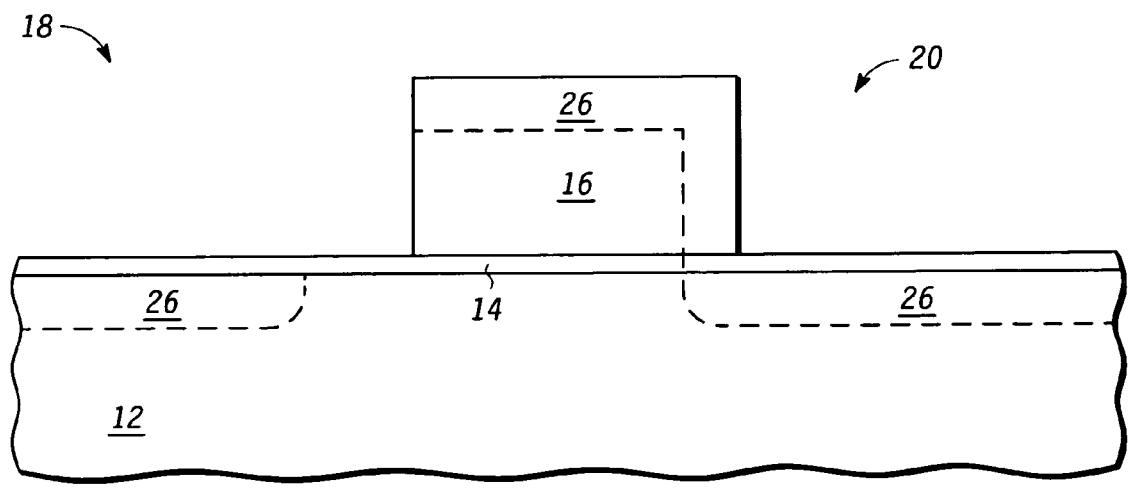
FIG. 2 illustrates the workpiece of FIG. 1 after implanting the oxidation enhancing species in accordance with an embodiment of the present invention.

FIG. 2 shows the resulting implanted oxidation enhanced regions 26 after performing an implantation of an oxidation enhancing species 22 at a tilt, in accordance with the embodiment illustrated in FIG. 1. The oxidation enhanced regions 26 are present in the drain region 20, the top surface of the gate electrode 16, and a first side of the gate electrode 16. The oxidation enhanced regions 26 are also present in a first portion of the source region 18 and a first portion of a second side of the gate electrode 16. The absence of the oxidation enhanced region 26 in a second portion of the source region 18 and a second portion of the second side of the gate electrode 16 is due to the shadow region. Thus, the area that is under and adjacent the second side of the gate electrode and a portion of the area of the gate electrode that is adjacent the second side of the gate electrode do not include the oxidation enhanced region 26. In contrast, the portion of the area under and adjacent the first side of the gate electrode and a portion of the area of the gate electrode that is adjacent the first side of the gate electrode does include the oxidation enhanced region 26.

Figure 3:
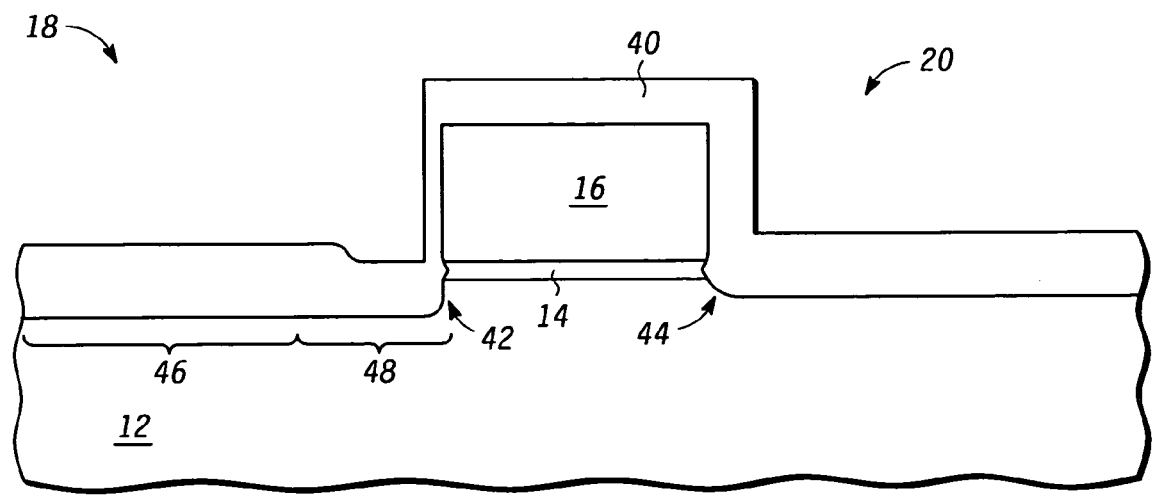
FIG. 3 illustrates the workpiece of FIG. 2 after forming a dielectric layer in accordance with an embodiment of the present invention.

As shown in FIG. 3, After forming the oxidation enhanced region 26, portions of the semiconductor substrate 12, and optionally portions of the gate electrode 16, are converted to a second dielectric layer 40. Portions of the gate electrode 16 may not be converted if the material chosen for the gate electrode 16 does not oxidize when exposed to the environment used to oxidize portions of the semiconductor substrate 12. Hence, the resulting dielectric material depends on the material used for the gate electrode 16 and the semiconductor substrate 12. In an embodiment, where the gate electrode 16 and the semiconductor substrate 12 include silicon, the second dielectric layer 40 is silicon dioxide. The second dielectric layer 40 may or may not be the same material used for the first dielectric layer 14.

In one embodiment, the conversion occurs by annealing the workpiece 10. For example, the conversion can occur by thermal oxidation in a dry oxygen environment at a temperature between approximately 700 and 1,000 degrees Celsius. An ambient of nitrogen and possibly oxygen may be used. The time for the thermal oxidation will vary based on the temperature used. For example, the duration of the thermal oxidation may be between 10 minutes to 2 hours. However, if the temperature of the thermal oxidation is approximately 1,000 degrees Celsius the duration of the thermal oxidation can be short, such as 10 minutes. As the temperature decreases, the duration will increase. However, the second dielectric layer 40 can be formed by any suitable method, such as other oxidation processes besides thermal oxidation.

As illustrated in FIG. 3 the portions of the second dielectric layer 40 that are formed in the oxidation enhanced region 26 of the gate electrode 16 and the semiconductor substrate 12 have a thickness greater than that of the rest of the second dielectric layer 40. If portions of the gate electrode 16 are converted to the second dielectric layer 40, the thickness of the second dielectric layer 40 on the second side of the gate electrode 16 is thinner than that of the second dielectric layer 40 on the first side of the gate electrode 16 due to the presence of the oxidation enhancement region 26 on the first side of the gate electrode 16 and the lack of the oxidation enhancement region 26 in areas adjacent the second side of the gate electrode 16.

Due to the oxidation enhanced regions 26, region 46 in the source region 18 is thicker than region 48 in the drain region 20. At the intersection of the gate electrode 16, the first dielectric layer 14, and the semiconductor substrate 12 that is adjacent the first side of the gate electrode 16 is a first dielectric area 44. At the intersection of the gate electrode 16, the first dielectric layer 14, and the semiconductor substrate 12 that is adjacent the second side of the gate electrode 16 is a second dielectric area 42. The first dielectric area 44 and the second dielectric area 42 both form bird's beaks, which is a name given to dielectric areas that have a bird beak shape, such as the bird's beaks that are created during LOCOS (local oxidation) processing to form isolation regions. Due to the absence of the oxidation enhancement region 26 in and near the second dielectric area 42, the second dielectric area 42 is smaller than the first dielectric area 44. In one embodiment, the thickness of the second dielectric area 42 is approximately ½ that of the first dielectric area 44. In one embodiment, the thickness of the second dielectric area 42 is approximately 2 nm and the thickness of the first dielectric area 44 is approximately 4 nm. As shown in FIG. 3, a third dielectric area lies between the first dielectric area 44 and the second dielectric area 42. The third dielectric area is thinner than both the first dielectric area 44 and the second dielectric area 42 because it was not substantially oxidized during the conversion processing. The third dielectric area is a portion of the first dielectric layer 14. Thus, the gate dielectric, which is the dielectric under the gate electrode 16, includes the first dielectric area 44, the second dielectric area 42, and a portion of the first dielectric layer 14. Thus, the gate dielectric is a dielectric with asymmetric bird beak's or dielectric regions, where the dielectric region at one end is thicker than the dielectric region at the other end. The first dielectric layer 14 may be the same material as the second dielectric layer 40. Alternatively, different materials may be used. In one embodiment, the gate dielectric is made of two dielectrics where the ends are the same material and the area between the ends is a different material; in addition, the ends are asymmetric dielectric regions, where the dielectric region at one end is thicker than the dielectric region at the other end.

The presence of the first dielectric area 44 and the second dielectric area 42 as part of the gate dielectric reduces delay and reduced capacitance in the semiconductor device without degradation in current. As the width of the first dielectric area 44 and the second dielectric area 42 increase, the drive current degrades. Since the thickness of the first dielectric area 44 is greater than that of the first dielectric layer 14 that forms the gate dielectric, the inversion layer that is formed during the functioning of the semiconductor device is pinched-off near the drain the saturation region making the saturation drain current insensitive to gate-drain overlap. The gate-drain overlap capacitance improves when the thickness of the first dielectric area 44 increases. The maximum steep improvement that may be able to be obtained is approximately 3.4%.

The first dielectric area 44 and the second dielectric area 42 may be entirely under the gate electrode or the gate electrode 16 and the second dielectric layer 40 surrounding the gate electrode 16, but some of these areas may extend outside the areas covered by the gate electrode 16 and the second dielectric layer 40. Regardless, at least part of the first dielectric area 44 and the second dielectric area 42 will be under the gate electrode 16.

Figure 4:
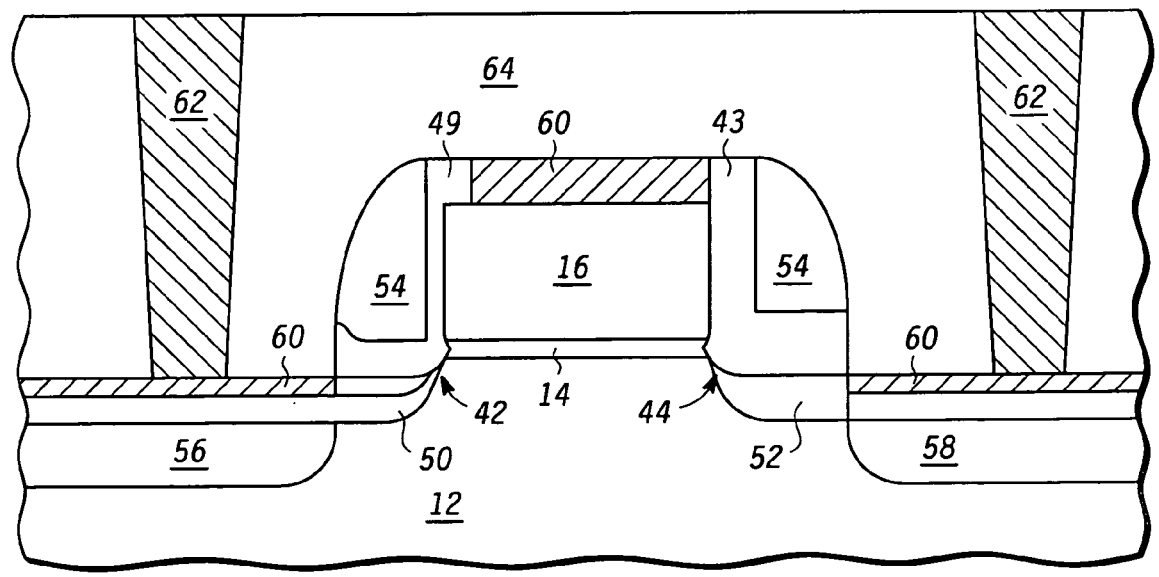
FIG. 4 illustrates the workpiece of FIG. 3 after additional processing to form a semiconductor device in accordance with an embodiment of the present invention.

After forming the second dielectric layer 40, conventional processing is continued to form a semiconductor device, as shown in FIG. 4. First, a source extension 50 and a drain extension 52 are formed in the source region 18 and the drain region 20, respectively. After forming the source extension 50 and the drain extension 52, a third dielectric layer, such as silicon nitride, is formed, for example by CVD, and patterned to form spacers 54. Next, a deep source region 56 is formed in the source region 18 and a deep drain region 58 is formed in the drain region 20. Portions of the second dielectric layer 40 may be removed to form the fourth dielectric 49 and the fifth dielectric 43 either when the spacers 54 are formed or after forming the deep source region 56 and the deep drain region 58. The fourth dielectric 49 is thinner than the fifth dielectric 43 because more oxidation enhancing species was present in the area that was converted into the fifth dielectric 43 than in the area that was converted into the fourth dielectric 49.

Next, silicide 60 is formed over the deep source region 56 and the deep drain region 58. In addition, if the gate electrode 16 includes silicon, silicide may be formed over the gate electrode 16. Next, an interlevel dielectric layer 64 is formed over the workpiece 10 and patterned to form openings, which are later filled with conductive material(s) to form contacts 62. In the cross-section shown in FIG. 4, the contacts 62 are formed in the source region 18 and the drain region 20. In addition, a contact (not shown) is formed and coupled to the gate electrode 16.

Figure 5:
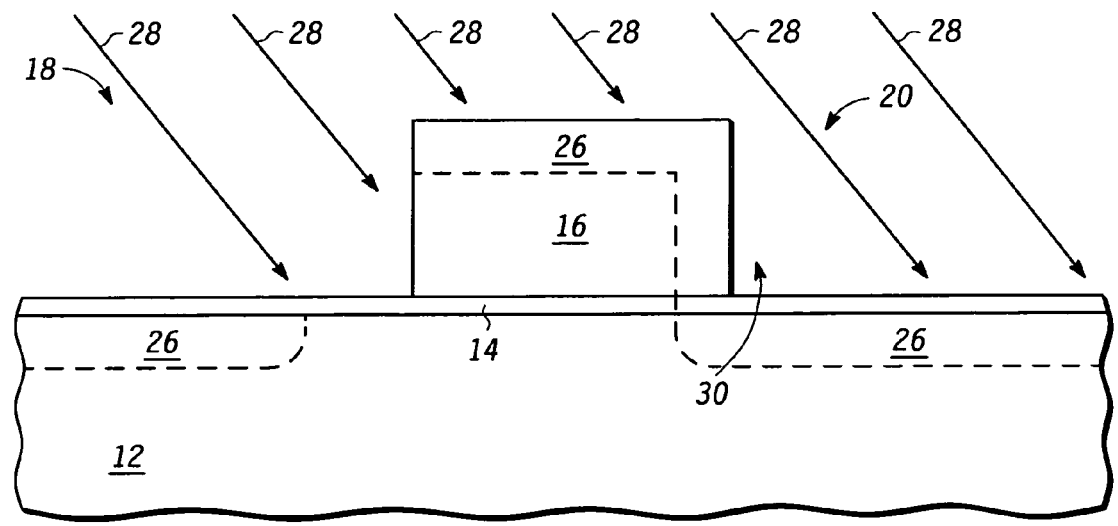
FIG. 5 illustrates the workpiece of FIG. 2 while implanting an oxidation reduction species in accordance with an embodiment of the present invention.
Figure 6:
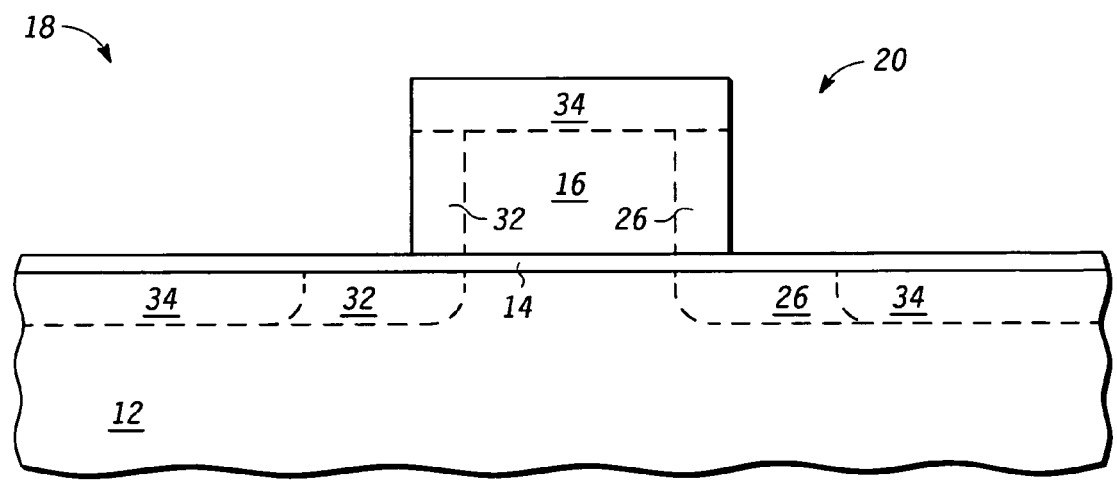
FIG. 6. illustrates the workpiece of FIG. 5 after implanting the oxidation reduction species in accordance with an embodiment of the present invention.

In the embodiment illustrated in FIGS. 1-4, an oxidation enhancing species was implanted. Alternatively, an oxidation reduction species is implanted. In another embodiment, the oxidation reduction species may be implanted in addition to the oxidation enhancing species, as illustrated in FIGS. 5 and 6. In other words, co-implantation of an oxidation enhancing species and an oxidation reduction species is performed in one embodiment.

As shown in FIG. 5 an oxidation reduction species 28, such as nitrogen, is implanted into the workpiece 10 after forming oxidation enhancement region 26. The oxidation reduction species 28 is implanted into portions of the semiconductor substrate 12 and the gate electrode 16 so that oxidation growth will be inhibited in these regions. Although not shown, a mask, such as photoresist, may be formed over the workpiece 10 (and over the semiconductor substrate 12) and be patterned to expose the areas where the oxidation reduction species 28 are to be implanted. If a mask is used, the implantation may occur perpendicular to the workpiece 10 or at a tilt so that the angle between the semiconductor substrate 12 and the implantation is less than ninety degrees. If a mask is not used or if the mask is patterned to expose both the source region 18 and the drain region 20, a tilt is preferred so that a shadow region 30 can be formed in one of the regions, which in a preferred embodiment is the drain region 20. The shadow region 30 is similar to the shadow region 24 of FIG. 1, because it is a region where none of the oxidation reduction species 28 will travel so that areas around the shadow region 30 will not be implanted with the oxidation reduction species 28. In the embodiment illustrated in FIG. 5 the shadow region 30 prevents oxidation reduction species 28 from being implanted into portions of the first dielectric layer 14, the gate electrode 16, and the semiconductor substrate 12, as will be better understood after discussing FIG. 6. In one embodiment, the tilt is approximately 5 to 30 degrees. However, the most desirable tilt will depend on the height and density of the gate electrode 16. The taller and more dense the gate electrode 16, it is desirable to use a lower tilt angle.

In one embodiment, the oxidation reduction species 28 is nitrogen. The energy used is desirably low enough so that the oxidation reduction species 28 reaches the desired depth in the semiconductor substrate 12 and the gate electrode 16. In one embodiment, the desired depth is between approximately 5 and 10 nm. In one embodiment, the energy is between approximately 1 and 3 keV. The energy chosen depends on the desired thickness, which can vary based on the dimensions of the features, other processing that may occur, and the species used. Furthermore, any dose can be used. In one embodiment, a dose of $1E15/cm^2$ is used.

FIG. 6 shows the resulting implanted oxidation enhancement regions 26, oxidation reducing regions 32, and the combined regions 34 that include both the oxidation reducing and enhancing species after performing an implantation of an oxidation reduction species 28 and the oxidation enhancing species 22 at a tilt. The oxidation enhanced regions 26 are present in the areas that were exposed to the oxidation enhancing species and were near the shadow region 30. The oxidation enhanced regions 26 are near the first side of the gate electrode 16. The oxidation reducing regions 32 are area that were exposed to the oxidation reducing species and were near the shadow region 24. The oxidation reducing regions are near the first side of the gate electrode 16. The combined regions 34 are in the drain region 20 at a distance separated from the are underlying the gate electrode 16, in the source region 18 at a distance separated from the are underlying the gate electrode 16, and in the top most area of the gate electrode 16.

After forming the oxidation reducing regions 32, portions of the semiconductor substrate 12, and optionally portions of the gate electrode 16, are converted to dielectric layer, using any process discussed in regards with FIG. 3. The oxidation reducing regions 32 will inhibit the growth of a dielectric and the oxidation enhanced region 26 will increase dielectric growth. The effect of the combined regions 34 on oxide growth will depend on the relative amounts of the oxidation reducing species and the oxidation enhancing species. The combined regions 34 may inhibit or increase dielectric growth. Instead, the effect of the oxidation reducing species and the oxidation enhancing species may cancel each other and therefore, the combined regions 34 will behave the same as the material would without any of oxidation reducing species and the oxidation enhancing species. Hence, the presence of the combined regions 34 may not affect the dielectric growth. After forming the dielectric layer, additional processing discussed with respect to FIG. 4 is performed.

In one embodiment, method for forming a semiconductor device includes forming a semiconductor substrate, forming a gate electrode over the semiconductor substrate having a first side and a second side, forming a gate dielectric under the gate electrode, wherein the gate dielectric has a first area under the gate electrode and adjacent the first side of the gate electrode, a second area under the gate electrode and adjacent the second side of the gate electrode, and a third area under the gate electrode that is between the first area and the second area, wherein the first area is thinner than the second area, and the third area is thinner than the first area and is thinner than the second area. In one embodiment, forming the gate dielectric under the gate electrode further includes forming a first dielectric layer, implanting an oxidation enhancing species into the semiconductor substrate to form oxidation enhancement regions, and oxidizing the oxidation enhancement regions; in one embodiment, implanting the oxidation enhancing species further includes implanting the oxidation enhancing species into the gate electrode to form oxidation enhancement regions; and in one embodiment, the implanting is performed at a tilt. In one embodiment, forming the gate dielectric under the gate electrode further includes forming a first dielectric layer, implanting an oxidation reduction species into the semiconductor substrate to form oxidation reducing regions, and oxidizing the semiconductor substrate. In one embodiment, implanting the oxidation enhancing species further includes implanting the oxidation reduction species into the gate electrode to form oxidation reducing regions, and in one embodiment, implanting is performed at a tilt. In one embodiment, forming the gate dielectric under the gate electrode further includes forming a first dielectric layer, implanting an oxidation enhancing species into the semiconductor substrate to form oxidation enhancement regions, implanting an oxidation reduction species into the semiconductor substrate to form oxidation reducing regions, and oxidizing the semiconductor substrate, wherein oxidizing includes forming a dielectric in the oxidation enhancement regions. In one embodiment, the method also includes forming a source extension region and a drain extension region after the forming the gate dielectric, wherein the source extension region is deeper than the drain extension region. In one embodiment, the method also includes forming a first spacer adjacent the first side of the gate electrode and a second spacer adjacent the second side of the gate electrode after the forming the gate dielectric In one embodiment, a method for forming a semiconductor device includes providing semiconductor substrate, forming a dielectric layer over the semiconductor substrate, forming a gate electrode over the dielectric layer, wherein the gate electrode has a first side and a second side opposite the first side, implanting an oxidation enhancing species into the first side of the gate electrode and a first area of the semiconductor substrate, wherein the first area is under the gate electrode and adjacent the first side of the gate electrode, converting the first area to a first dielectric and a second area of the semiconductor substrate, wherein the second area is under the gate electrode and adjacent the second side of the gate electrode, to a second dielectric, wherein the thickness of the first dielectric is greater than the thickness of the second dielectric. In one embodiment, converting includes annealing the semiconductor substrate. In one embodiment, implanting includes implanting at least a species selected from the group consisting of germanium, oxygen, fluorine, and chlorine. In one embodiment, the method also includes implanting an oxidation reduction species into the second area. In one embodiment, the implanting the oxidation reduction species includes implanting nitrogen. In one embodiment, the method also includes forming a source extension region and a drain extension region after the converting, the first area and the second area, wherein the source extension region is deeper than the drain extension region. In one embodiment, the method also includes forming a first spacer adjacent the first side of the gate electrode and a second spacer adjacent the second side of the gate electrode after the converting. In one embodiment, implanting is performed at a tilt.

In one embodiment, semiconductor device includes a semiconductor substrate, a gate electrode over the semiconductor substrate having a first side and a second side, and a gate dielectric under the gate electrode, wherein the gate dielectric has a first area under the gate electrode and adjacent the first side of the gate electrode, a second area under the gate electrode and adjacent the second side of the gate electrode, and a third area under the gate electrode that is between the first area and the second area, wherein the first area is thinner than the second area, and the third are is thinner than the first area and is thinner than the second area. In one embodiment, the first side of the gate electrode includes a first dielectric and second side includes a second dielectric, wherein the second dielectric is thicker than the first dielectric. In one embodiment, the first area is at least approximately 2 times the thickness of the second area. In one embodiment, the semiconductor device also includes extension regions wherein region under first area is deeper than region under the second area. In one embodiment, the first area is the source region and the second area is the drain region. In one embodiment, the first area is the drain region and the second area is the source region.

By now it should be appreciated that there has been provided a structure in which a bird's beak dielectric is formed thicker on one side of a gate dielectric, such as the drain side of a semiconductor device. Alternatively, the thicker dielectric can be on the source side. In addition, a method to make such as structure is taught by performing an oxidation enhancing implant, an oxidation reducing implant, or both. In one embodiment, angled implants that allow shadow on one side and oxidation enhancing or reducing species on the other are used. This method is cost effective to implement since a maskless implant procedure or a process using only one additional mask is used. The resulting structure offers enhanced performance, such as reduced delay and reduced capacitance (both $C_{gd}$ and Miller capacitance) without degradation in current. In addition, having a thick oxide at the point of the highest field (e.g., the drain region next to the gate electrode) will reduce leakage and improve reliability.

In the foregoing specification, the invention has been described with reference to specific embodiments. However, one of ordinary skill in the art appreciates that various modifications and changes can be made without departing from the scope of the present invention as set forth in the claims below. For example, a different semiconductor device than that shown in the figures may be used. For example, the semiconductor device can be a FinFET or a nonvolatile memory (NVM) device.

Accordingly, the specification and figures are to be regarded in an illustrative rather than a restrictive sense, and all such modifications are intended to be included within the scope of the present invention.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one.

What is claimed is:

1. A method for forming a semiconductor device, the method comprising:
   providing a semiconductor substrate;
   forming a gate electrode over the semiconductor substrate having a first side and a second side; and
   forming a gate dielectric under the gate electrode, wherein the gate dielectric has a first area under the gate electrode and adjacent the first side of the gate electrode; a second area under the gate electrode and adjacent the second side of the gate electrode; and a third area under the gate electrode that is between the first area and the second area; wherein the first area is thinner than the second area, and the third area is thinner than the first area and is thinner than the second area.

2. The method of claim 1 wherein the forming the gate dielectric under the gate electrode further comprises:
   forming a first dielectric layer;
   implanting an oxidation enhancing species into the semiconductor substrate to form oxidation enhancement regions; and
   oxidizing the oxidation enhancement regions.

3. The method of claim 2, wherein the implanting the oxidation enhancing species further comprises implanting the oxidation enhancing species into the gate electrode to form oxidation enhancement regions.

4. The method of claim 2, wherein the implanting is performed at a tilt.

5. The method of claim 1 wherein the forming the gate dielectric under the gate electrode further comprises:
   forming a first dielectric layer;
   implanting an oxidation reduction species into the semiconductor substrate to form oxidation reducing regions; and
   oxidizing the semiconductor substrate.

6. The method of claim 5, wherein the implanting the oxidation enhancing species further comprises implanting the oxidation reduction species into the gate electrode to form oxidation reducing regions.

7. The method of claim 5, wherein the implanting is performed at a tilt.

8. The method of claim 1 wherein the forming the gate dielectric under the gate electrode further comprises:
   forming a first dielectric layer;
   implanting an oxidation enhancing species into the semiconductor substrate to form oxidation enhancement regions;
   implanting an oxidation reduction species into the semiconductor substrate to form oxidation reducing regions; and
   oxidizing the semiconductor substrate, wherein oxidizing comprises forming a dielectric in the oxidation enhancement regions.

9. The method of claim 1, further comprising:
   forming a source extension region and a drain extension region after the forming the gate dielectric, wherein the source extension region is deeper than the drain extension region.

10. The method of claim 1, further comprising:
    forming a first spacer adjacent the first side of the gate electrode and a second spacer adjacent the second side of the gate electrode after the forming the gate dielectric.

11. A method for forming a semiconductor device, the method comprising:
    providing a semiconductor substrate;
    forming a dielectric layer over the semiconductor substrate;
    forming a gate electrode over the dielectric layer, wherein the gate electrode has a first side and a second side opposite the first side;
    implanting an oxidation enhancing species into the first side of the gate electrode and a first area of the semiconductor substrate, wherein the first area is under the gate electrode and adjacent the first side of the gate electrode; and
    converting the first area to a first dielectric and a second area of the semiconductor substrate, wherein the second area is under the gate electrode and adjacent the second side of the gate electrode, to a second dielectric, wherein the thickness of the first dielectric is greater than the thickness of the second dielectric.

12. The method of claim 11, wherein the converting comprises annealing the semiconductor substrate.

13. The method of claim 11, wherein the implanting comprises implanting at least a species selected from the group consisting of germanium, oxygen, fluorine, and chlorine.

14. The method of claim 11, further comprises implanting an oxidation reduction species into the second area.

15. The method of claim 14, wherein the implanting the oxidation reduction species comprises implanting nitrogen.

16. The method of claim 11, further comprising:
    forming a source extension region and a drain extension region after the converting, the first area and the second area, wherein the source extension region is deeper than the drain extension region.

17. The method of claim 11, further comprising:
    forming a first spacer adjacent the first side of the gate electrode and a second spacer adjacent the second side of the gate electrode after the converting.

18. The method of claim 11, wherein the implanting is performed at a tilt.

* * * * *